(12) United States Patent
Collins et al.

(10) Patent No.: US 10,983,155 B2
(45) Date of Patent: Apr. 20, 2021

(54) APPARATUS TO DETECT A FAULT IN A WIRE

(71) Applicant: GE Aviation Systems Limited, Cheltenham (GB)

(72) Inventors: John Oliver Collins, Cheltenham (GB); Russell Mark Compton, Droitwich Spa (GB); Peter James Handy, Cheltenham (GB); Denis Vaughan Weale, Cheltenham (GB)

(73) Assignee: GE Aviation Systems Limited, Cheltenham (GB)

(*) Notice: Subject to any disclaimer, the term of this patent is extended or adjusted under 35 U.S.C. 154(b) by 306 days.

(21) Appl. No.: 15/964,037

(22) Filed: Apr. 26, 2018

(65) Prior Publication Data
US 2018/0348280 A1 Dec. 6, 2018

(30) Foreign Application Priority Data

Jun. 2, 2017 (GB) ...................................... 1708830

(51) Int. Cl.
| | | |
|---|---|---|
| *G01R 31/08* | (2020.01) | |
| *G01R 31/00* | (2006.01) | |
| *H02H 7/26* | (2006.01) | |
| *G08B 21/18* | (2006.01) | |
| *H02H 1/00* | (2006.01) | |
| *H02H 7/22* | (2006.01) | |
| *H02H 5/10* | (2006.01) | |

(52) U.S. Cl.
CPC ......... *G01R 31/008* (2013.01); *G01R 31/085* (2013.01); *G08B 21/185* (2013.01); *H02H 1/0007* (2013.01); *H02H 7/228* (2013.01); *H02H 7/26* (2013.01); *H02H 5/10* (2013.01)

(58) Field of Classification Search
None
See application file for complete search history.

(56) References Cited

U.S. PATENT DOCUMENTS

| | | | |
|---|---|---|---|
| 3,803,484 A | 4/1974 | Gray | |
| 4,271,444 A * | 6/1981 | Howell | ............... H02H 1/0069 361/48 |
| 4,301,399 A | 11/1981 | Miller et al. | |
| 6,011,399 A | 1/2000 | Matsumaru et al. | |
| 6,366,095 B1 | 4/2002 | Van Aartrijk | |
| 7,512,503 B2 | 3/2009 | Bechhoefer et al. | |

(Continued)

FOREIGN PATENT DOCUMENTS

| | | |
|---|---|---|
| CN | 1251654 A | 4/2000 |
| CN | 101138139 A | 3/2008 |

(Continued)

OTHER PUBLICATIONS

Combined Search and Examination Report issued in connection with corresponding GB Application No. 1708830.3 dated Aug. 24, 2017.

*Primary Examiner* — Jeffrey A Gblende
(74) *Attorney, Agent, or Firm* — McGarry Bair PC

(57) ABSTRACT

An apparatus and method for managing the detection of faults in a wiring system. The wiring system is made up of supply wires and can include return wires. The supply wire connects a power supply to a load end. The fault detecting apparatus is positioned along the wire between the power supply and the load end and can include a first and second resistor, a voltage monitor, and an indicator.

20 Claims, 4 Drawing Sheets

(56) References Cited

U.S. PATENT DOCUMENTS

| | | | |
|---|---|---|---|
| 7,623,329 B2 * | 11/2009 | Williams | ............... H01H 83/02 |
| | | | 361/42 |
| 8,593,153 B2 | 11/2013 | Medelius et al. | |
| 8,796,547 B2 | 8/2014 | Kukowski | |
| 9,305,731 B2 | 4/2016 | Schult et al. | |
| 9,425,614 B2 | 8/2016 | Xiong et al. | |
| 9,746,512 B2 | 8/2017 | Shipley | |
| 2005/0128661 A1 | 6/2005 | Maeckel et al. | |
| 2008/0108252 A1 | 5/2008 | Williams | |
| 2008/0243402 A1 * | 10/2008 | Rene | ....................... H04M 3/10 |
| | | | 702/58 |
| 2011/0169498 A1 | 7/2011 | Shipley | |
| 2014/0292360 A1 * | 10/2014 | Morgenstern | .......... G01R 21/00 |
| | | | 324/713 |
| 2015/0214718 A1 | 7/2015 | Rubython et al. | |
| 2017/0259927 A1 * | 9/2017 | Schram | ............... H02H 1/0007 |

FOREIGN PATENT DOCUMENTS

| | | |
|---|---|---|
| CN | 101615808 A | 12/2009 |
| CN | 102159956 A | 8/2011 |
| CN | 102608526 A | 7/2012 |
| CN | 103384446 A | 11/2013 |
| CN | 103534894 A | 1/2014 |
| CN | 104937801 A | 9/2015 |
| DE | 10017455 A1 | 10/2001 |
| EP | 1 114 752 A2 | 7/2001 |
| EP | 1114752 A2 * | 7/2001 ............... H02H 5/10 |
| JP | 2005-45896 A | 2/2005 |
| KR | 101095598 B1 | 12/2011 |
| WO | 2016/137424 A1 | 9/2016 |

\* cited by examiner

APPARATUS TO DETECT A FAULT IN A WIRE

CROSS REFERENCE TO RELATED APPLICATION

This application claims priority to and benefit of pending Great Britain Patent Application No. 17088303, filed Jun. 2, 2017, now issued as GB 2563069, which is incorporated herein in its entirety.

BACKGROUND OF THE INVENTION

Commercial aircraft typically include an electrical power distribution system. The purpose of the electrical power distribution system is to distribute electricity to the loads on the aircraft, protect wires and loads from hazards, and to route the most appropriate power source to each load. Fault detecting mechanisms along the wiring within the power distribution system can be helpful for maintenance and safety.

BRIEF DESCRIPTION

In one aspect, the present disclosure relates an apparatus to detect a fault in a supply wire connecting a load to a power supply and extending from a first end to a second end, the apparatus comprising a conductive screen surrounding at least a portion of and spaced from the supply wire and extending between the first end and the second end, a first resistive element connected between the supply wire and the screen at the first end, a voltage monitor disposed to measure a voltage at the screen at the second end, and an indicator coupled to the voltage monitor, wherein if the measured voltage of the screen at the second end deviates from a reference voltage, the indicator is configured to indicate a fault.

In another aspect, the present disclosure relates a method of detecting a fault in a supply wire connecting a power supply at a supply end and a load at a load end, the method comprising measuring voltage at the supply end of a conductive screen surrounding and spaced from supply wire and extending between the supply end and the load end; comparing the measured voltage to a reference voltage; and indicating a fault if the measured voltage deviates from the reference voltage.

DETAILED DESCRIPTION

Figure 1:
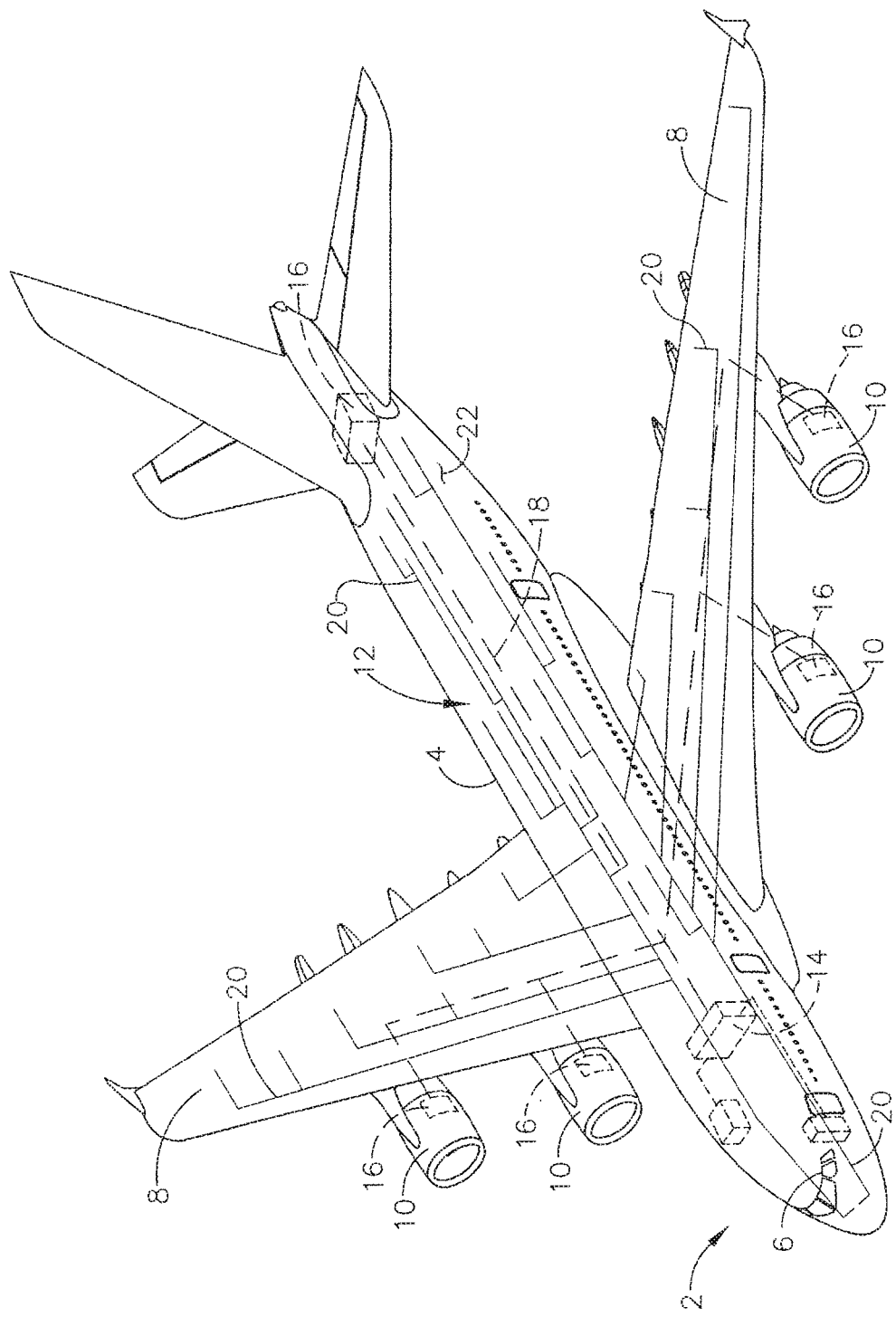
FIG. 1 is a schematic diagram of an aircraft with a power distribution system with wiring distributed throughout the aircraft.

Aspects of the present disclosure are directed to a fault detecting apparatus. For purposes of illustration, the present disclosure will be described with respect to an aircraft power distribution system. It will be understood, however, that the present disclosure is not so limited and can have general applicability in non-aircraft applications, such as other fault detecting requirements in non-aircraft power distribution applications.

Aspects of the present disclosure discussed herein provide a detection system for failure of aircraft electrical power transmission wires. A standard conduction wire is modified to be a screened wire. The screen is utilized to provide additional physical protection for the power carrying wire and to detect various failures in the connectivity of the wires or of any breakdown in insulation of the wiring.

As used herein "a set" can include any number of the respectively described elements, including only one element. Additionally, all directional references (e.g., radial, axial, proximal, distal, upper, lower, upward, downward, left, right, lateral, front, back, top, bottom, above, below, vertical, horizontal, clockwise, counterclockwise, upstream, downstream, aft, etc.) are only used for identification purposes to aid the reader's understanding of the present disclosure, and do not create limitations, particularly as to the position, orientation, or use of the present disclosure. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 illustrates an aircraft 2 which can also include a fuselage 4, a cockpit 6 positioned in the fuselage 4, and wing assemblies 8 extending outward from the fuselage 4. The aircraft 2 can also include multiple engines, including turbine engines 10 which by way of non-limiting example can be turbojet engines, turbofan engines, or turboprop engines. While a commercial aircraft 2 has been illustrated, it is contemplated that aspects of the disclosure described herein can be used in any type of aircraft 2. Further, while two turbine engines 10 have been illustrated on each of the wing assemblies 8, it will be understood that any number of turbine engines 10 including a single turbine engine 10 on the wing assemblies 8, or even a single turbine engine mounted in the fuselage 4 can be included.

A power distribution system 12 is illustrated in phantom. A power distribution system unit 14 can be coupled to at least one generator 16 by a main power feed 18 in order to receive electrical power. It is contemplated that the power distribution unit 14 can be coupled to multiple generators 16 as illustrated. The power distribution unit 14 can then distribute power via electrical wires 20 throughout the aircraft depending on load requirements for different operating systems. An aircraft structure 22 can be utilized as a return wire for certain operating systems. It should be understood that other unit arrangements for different aircraft engine arrangements would also benefit from the disclosure discussed herein and that the exemplary electrical wires 20 are for illustrative purposes only and not meant to be limiting.

Figure 2:
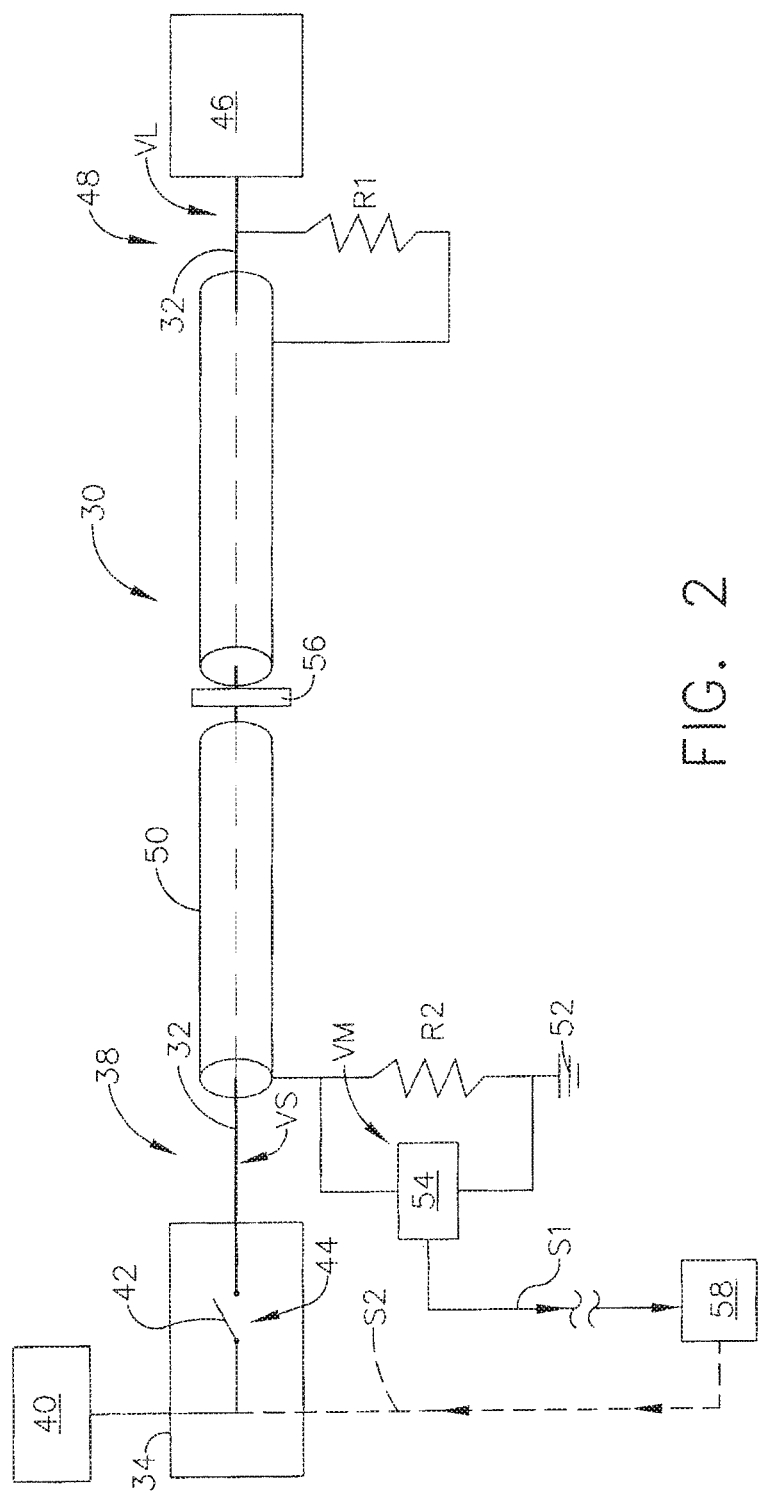
FIG. 2 is a schematic diagram of an exemplary fault detecting apparatus for the power distribution system of FIG. 1.

FIG. 2 is an exemplary fault detecting apparatus 30 that can be used in the power distribution system 12. The fault detecting apparatus 30 can be provided at any appropriate location along the electrical wires 20, by way of non-limiting example along a supply wire 32. The supply wire 32 can extend between a first end and a second end where the first end is a load end 48 at a load 46, and the second end is a supply end 38 at a power supply 40. The supply wire 32 connects to a protection device 34 at the supply end 38. The protection device 34 is further coupled to the power supply 40 and can include a switch 42. The switch 42 can be in an open 44 or closed (not shown) state.

The power supply 40 utilized can be any number of aircraft architecture topologies and be associated with multiple voltages. By way of non-limiting example, a 28 Vdc or 270 Vdc system can be distributed with wiring 20 throughout the aircraft and returned through the aircraft structure 22 or a return network. A 115 Vac system can either be distributed as a three phase or a single phase and returned through the aircraft structure 22 or a return network. Systems of +/−270 Vdc are typically distributed and returned through a pair of wires 20.

The supply wire 32 extends from the power supply 40 to the load 46 at the load end 48. The load 46 can be any type of electrical load in the aircraft, including but not limited to auxiliary hydraulic pumps, fuel boost pumps, lighting, avionics, ice and rain protection, commercial loads, and cargo loading.

A conductive screen 50 surrounds and is spaced from the supply wire 32 with an insulator (not shown). The conductive screen 50 can extend from the supply end 38 to the load end 48. A first resistive element, by way of non-limiting example a resistor R1 of known resistance is coupled to the supply wire 32 at the load end 48 and to the conductive screen 50 at the load end 48. A second resistive element, by way of non-limiting example a resistor R2 of known resistance is coupled to the conductive screen 50 at the supply end 38 and to a ground 52, which can be by way of non-limiting example the aircraft structure 22. A voltage monitor 54 is connected in parallel with the resistor R2 such that a voltage across the resistor R2 is read and monitored during operation.

A connector 56 is provided at a central location of the fault detecting apparatus 30 for illustrative purposes. The connector 56 illustrates that the conductive screen 50 and the supply wire 32 can pass through barriers and still conduct electrical power.

An indicator 58 is coupled to the voltage monitor 54 to indicate a fault in the supply wire 32. A measured voltage VM can be displayed as read by the voltage monitor 54 on the indicator 58. It is also contemplated that the indicator 58 can simply indicate that a failure in the supply wire 32 has occurred by a light, audible signal, or a processor output. The indicator 58 can be in a remote location physically separate from the rest of the fault detecting apparatus 30.

During normal operation, current supplied to the load would be a known amount due to the known loads and known resistors R1, R2. The resistor values R1, R2 are based on a reference voltage VR. The reference voltage VR is derived from known voltages VS, VL at the supply end 38 and load end 48 respectively. Therefore the reference voltage VR is a fraction of the amount of the voltages VS or VL at the supply or load ends 38, 48. It is contemplated that the reference voltage VR is ⅓ of the voltage VS or VL, by way of non-limiting example the reference voltage VR is ⅓ of the voltage VL at the load end 48.

Under normal operating circumstances, the voltage monitor 54 will indicate a measured voltage VM equal to the reference voltage VR. The reference voltage VR depends on the circuit to which the voltage monitor 54 is connected, and can therefore be any range of voltages. In a failure event of the supply wire 32, the voltage monitor 54 will read a measured voltage VM that deviates from the reference voltage VR and send a signal S1 to the indicator 58.

In an event where the supply wire 32 is damaged or broken, a high impedance or series arc can occur. In this instance, the voltage monitor 54 will indicate a measured voltage VM that is less than the reference voltage VR.

In an event where the conductive screen 50 is damaged or broken, a high impedance or a short circuit to ground will occur. In this instance the voltage monitor 54 will indicate a measured voltage VM that is less than the reference voltage VR.

In an event where the supply wire 32 includes a short circuit to ground, again a lower voltage than expected will occur and the measured voltage VM will be less than the reference voltage VR.

In an event where the supply wire 32 is damaged and the damaged portion is within the conductive screen 50, a parallel arc can occur. In this instance the voltage monitor 54 will indicate a measured voltage VM that is greater than the reference voltage VR.

The events described herein are for illustrative purposes only and not meant to be limiting. The events can be any event in which a fault in the wiring 20 has been detected. The indicator 58 can be electrically coupled to the protection device 34 to send an additional signal S2 that causes the switch 42 to open and in doing so turns off the power to the load 46.

Figure 3:
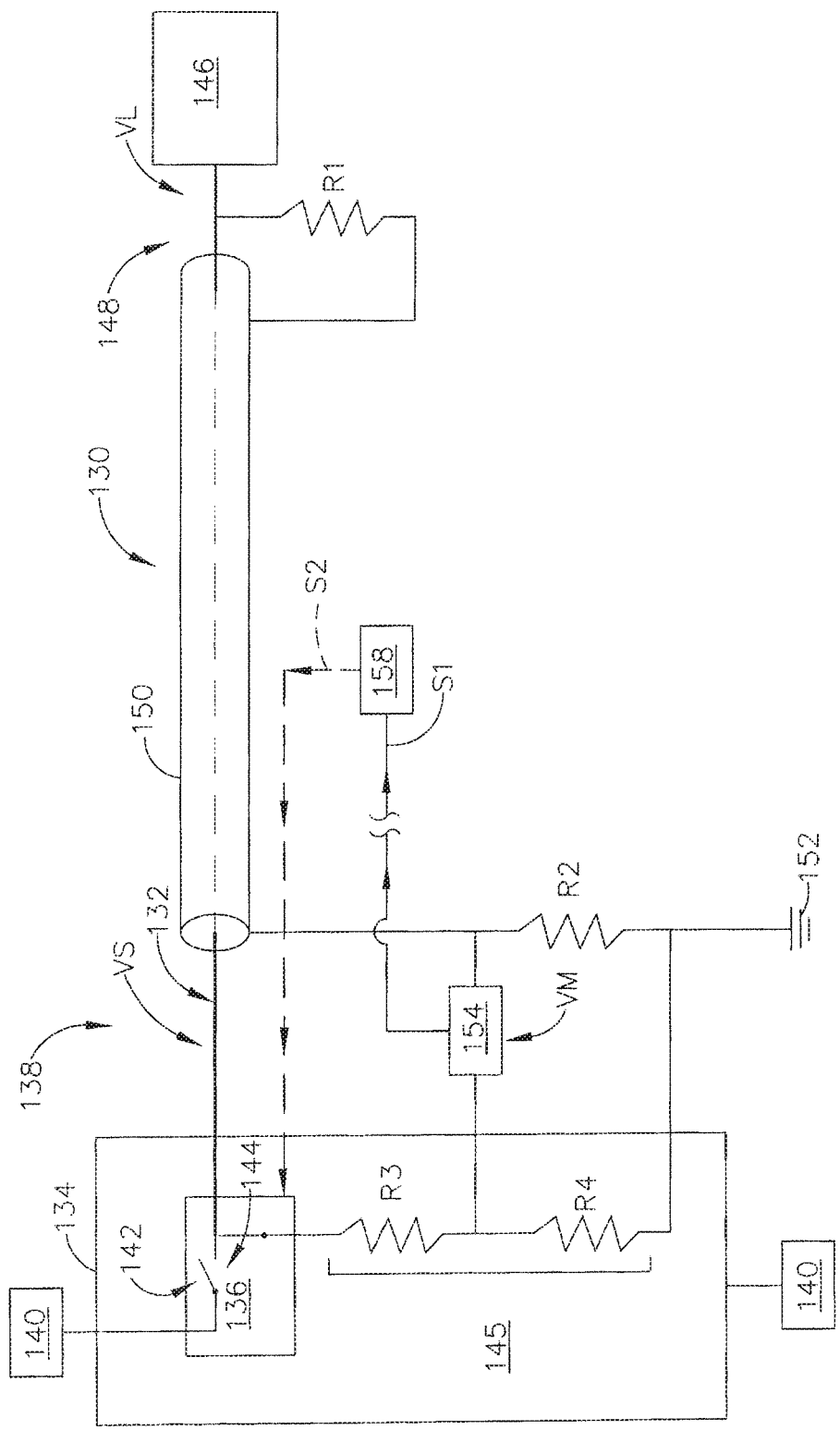
FIG. 3 is a schematic diagram of a second exemplary fault detecting apparatus for the power distribution system of FIG. 1.

Another exemplary fault detecting apparatus 130 is illustrated in FIG. 3. The fault detecting apparatus 130 is similar to the fault detecting apparatus 30 (FIG. 2), therefore, like parts will be identified with like numerals increased by 100, with it being understood that the description of the like parts of the fault detecting apparatus 30 applies to the fault detecting apparatus 130, unless otherwise noted.

In fault detecting apparatus 130, the protection device 34 of the first exemplary fault detecting apparatus 30 is a Solid State Power Converter (SSPC) 134. The SSPC 134 enables the power distribution system 12 to transform DC voltages received into differing voltages for multiple loads. The SSPC 134 can include a transistor 136, by way of non-limiting example a field-effect transistor circuit and a pull-down circuit 145. The pull-down circuit 145 can include two additional resistive elements, by way of non-limiting example resistors R3 and R4.

The transistor 136 is a switch 142 that even when in an open 144 state will leak current. The leakage current will cause a leakage voltage to appear on the supply wire 132. In this case faults in the supply wire 132 can be detected when the power source is turned off. The pull-down circuit 145 can ensure a steady voltage as measured by the voltage monitor 154 even when the switch 142 is in an open 144 state.

Under normal operating circumstances, the voltage monitor 154 will indicate a measured voltage VM equal to the reference voltage VR. The reference voltage VR in the fault detecting apparatus 130 is determined again by R1 and R2, along with known resistances R3 and R4 of the pull-down circuit 145. In a failure event of the supply wire 132, the voltage monitor 154 will read a measured voltage VM that deviates from the reference voltage VR and send a signal S1 to the indicator 158.

Figure 4:
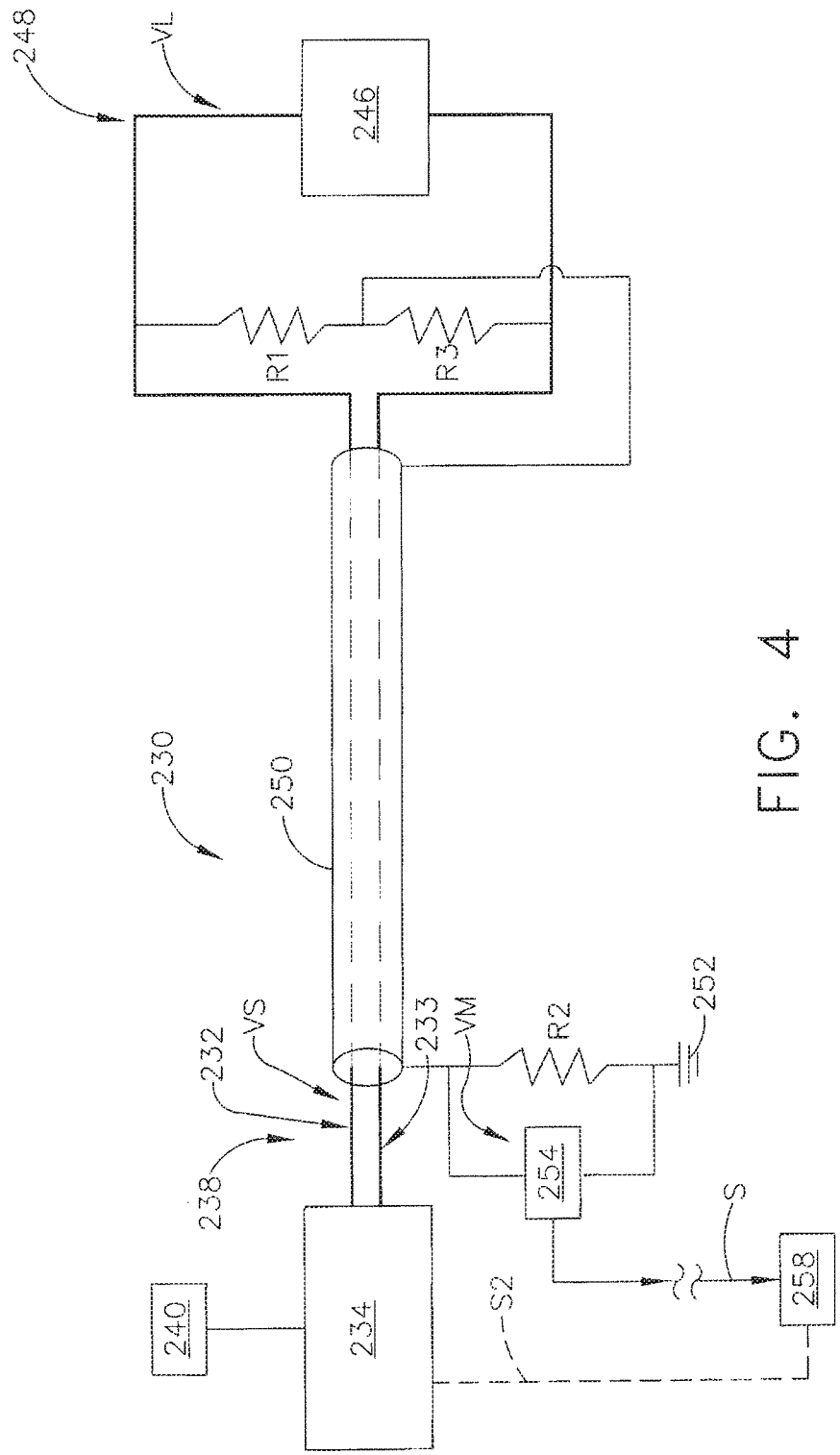
FIG. 4 is a schematic diagram of a third fault detecting apparatus for the power distribution system of FIG. 1.

Additionally, turning to FIG. 4, a fault detecting apparatus 230 for use in a circuit with a supply wire 232 and a return wire 233. The fault detecting apparatus 230 is similar to the fault detecting apparatus 30 (FIG. 2), therefore, like parts will be identified with like numerals increased by 200, with it being understood that the description of the like parts of the fault detecting apparatus 30 applies to the fault detecting apparatus 230, unless otherwise noted.

The fault detecting apparatus 230 is a modified version of the fault detecting apparatus 30 in that resistors R1 and R3 couple the supply wire 232 to the return wire 233. R1 and R3 are of known resistance but have differing values in order to bias a nominal voltage to a non-zero value. For example, Resistor R3 could be twice the resistance of R1.

Under normal operating circumstances, the voltage monitor 254 will indicate a measured voltage VM equal to the reference voltage VR. The reference voltage VR depends on the R1, R2, and R3 values. In a failure event of the supply wire 232 or the return wire 233, the voltage monitor 254 will read a measured voltage VM that deviates from the reference voltage VR and send a signal S1 to the indicator 258.

A method of detecting a fault in the supply wire 32 as described herein includes measuring a voltage VM at the supply end 38 of the conductive screen 50 that is surrounding and spaced from the supply wire 32. The method further includes comparing the measured voltage VM to the reference voltage VR and indicating a fault if the measured voltage VM deviates from the reference voltage VR. A threshold amount can be utilized at the indicator to minimize false signaling to the switch 42. In this manner the method of includes indicating a fault only if the measured voltage VM deviates from the reference voltage VR more than a threshold amount. The method includes measuring the voltage across resistor R2 with voltage monitor 54 as discussed with fault detecting apparatus 30 and 230. The method further includes measuring the voltage with voltage monitor 154 connected between the pull-down circuit 145 of the SSPC 134 and the conductive screen 150 as discussed with fault detecting apparatus 130.

The method can further include indicating the fault with, by way of non-limiting example, one of a light, an audible signal, or a processor output. Upon receiving a signal S1 indicating a fault, the method can include sending a signal S2 to switch the power supply to the supply wire 52 off when a fault is indicated. In the case of utilizing the SSPC 134, the switching can include opening the field effect transistor 136 in the SSPC 134.

Aspects of the disclosure discussed herein minimize the likelihood of arc faults occurring within the power distribution system. Likewise, minimizing the likelihood of arc faults also minimizing maintenance requirements. The fault detecting apparatus as described herein can be utilized to perform necessary maintenance.

The disclosure discussed herein provides a solution for detecting arcing or power loss within the electrical power wiring and connectors of a power distribution system. The fault detecting apparatus can detect a failure in the wiring before there is significant energy loss and hence damage.

To the extent not already described, the different features and structures of the various embodiments may be used in combination with each other as desired. That one feature may not be illustrated in all of the embodiments and is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure.

This written description uses examples to disclose the present disclosure, including the best mode, and to enable any person skilled in the art to practice the present disclosure, including making and using any devices or systems and performing any incorporated methods. The patentable scope of the present disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An apparatus to detect a fault in a supply wire connecting a load to a power supply and extending from a first end to a second end, the apparatus comprising:
a conductive screen surrounding at least a portion of and spaced from the supply wire and extending between the first end and the second end;
a first resistive element connected between the supply wire and the conductive screen at the first end such that the conductive screen is connected with and energized by the supply wire, and wherein the conductive screen includes a reference voltage from the supply wire;
a voltage monitor disposed to measure a voltage at the conductive screen at the second end;
an indicator coupled to the voltage monitor; and
wherein if the measured voltage of the conductive screen at the second end deviates from the reference voltage, the indicator is configured to indicate a fault.

2. The apparatus of claim 1, further comprising a second resistive element connected between the conductive screen and ground and the second end.

3. The apparatus of claim 2, wherein a selected resistance of the first or second resistive element is based on the reference voltage.

4. The apparatus of claim 2, wherein the voltage monitor is connected in parallel with the second resistive element.

5. The apparatus of claim 1, wherein the reference voltage is a fraction of a voltage of the supply wire at the first end.

6. The apparatus of claim 5, wherein the fraction is ⅓.

7. The apparatus of claim 1, further comprising a switch that stops power from the power supply when the indicator indicates a fault.

8. The apparatus of claim 1, wherein the indicator is one of a light, an audible signal, or a processor output.

9. The apparatus of claim 1, wherein the power supply includes a solid state power converter (SSPC) with a pull down circuit, and the voltage monitor is connected between the pull down circuit and the conductive screen in parallel with a second resistive element.

10. The apparatus of claim 1, further comprising a return wire between the load and the power supply wherein a third resistive element is connected in series with the first resistive element between the supply wire and the return wire.

11. The apparatus of claim 10, wherein the first and third resistive elements are biased to provide a non zero voltage.

12. The apparatus of claim 1, wherein the first end is a load end and the second end is a supply end and the first resistive element is a resistor.

13. The apparatus of claim 1, further comprising a connector in the supply wire, wherein the conductive screen has two portions with each portion on either side of the connector and the portions are electrically coupled to each other.

14. A method of detecting a fault in a supply wire connecting a power supply at a supply end and a load at a load end, the method comprising:
measuring voltage at the supply end of a conductive screen surrounding and spaced from supply wire and extending between the supply end and the load end such that the conductive screen is connected with and energized by the supply wire, and wherein the conductive screen includes a reference voltage from the supply wire;

comparing the measured voltage to the reference voltage; and indicating a fault if the measured voltage deviates from the reference voltage.

15. The method of claim 14, wherein the indicating occurs if the measured voltage deviates from the reference voltage more than a threshold amount.

16. The method of claim 14, wherein the measuring occurs by a voltage monitor connected in parallel with a resistor connected between the conductive screen and ground at the supply end.

17. The method of claim 16, wherein the measuring occurs by the voltage monitor connected between a pull down circuit of a Solid State Power Converter (SSPC) in the power supply and the conductive screen in parallel with the resistor.

18. The method of claim 14, wherein the indicating includes one of a light, an audible signal, or a processor output.

19. The method of claim 14, wherein the reference voltage is a fraction of the voltage of the supply wire at the load end.

20. The method of claim 14, further comprising switching the power supply to the supply wire off when a fault is indicated.

* * * * *